United States Patent
Hashii et al.

(10) Patent No.: US 10,058,002 B2
(45) Date of Patent: Aug. 21, 2018

(54) CASING AND RUBBER PLUG OF POWER CONVERSION EQUIPMENT

(71) Applicant: Mitsubishi Electric Corporation, Tokyo (JP)

(72) Inventors: Naoya Hashii, Tokyo (JP); Naoki Honishi, Tokyo (JP); Kohei Ando, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/555,583

(22) PCT Filed: Jun. 3, 2015

(86) PCT No.: PCT/JP2015/066021
§ 371 (c)(1),
(2) Date: Sep. 5, 2017

(87) PCT Pub. No.: WO2016/194163
PCT Pub. Date: Dec. 8, 2016

(65) Prior Publication Data
US 2018/0042132 A1  Feb. 8, 2018

(51) Int. Cl.
*H05K 5/06* (2006.01)
*H05K 5/02* (2006.01)

(52) U.S. Cl.
CPC ........... *H05K 5/069* (2013.01); *H05K 5/0247* (2013.01)

(58) Field of Classification Search
CPC ........ H05K 5/069; H05K 5/0247; H02M 7/48
See application file for complete search history.

(56) References Cited

U.S. PATENT DOCUMENTS 4,167,301 A * 9/1979 Mundschenk ....... H05K 5/0247
439/457
4,324,826 A * 4/1982 Ginster .................... B60J 10/24
428/122

(Continued)

FOREIGN PATENT DOCUMENTS

JP  2011-163148 A  8/2011

OTHER PUBLICATIONS

International Search Report for PCT/JP2015/066021 dated Sep. 1, 2015.

(Continued)

*Primary Examiner* — Hoa C Nguyen
*Assistant Examiner* — Christopher L Augustin
(74) *Attorney, Agent, or Firm* — Sughrue Mion, PLLC; Richard C. Turner (57) ABSTRACT

It is structured that plural service holes are provided on a surface of the casing, that a flange of a rubber plug for sealing the service hole has a lip seal that abuts against the casing of the power conversion equipment, that the rubber plug has a recessed section, that the surface of the casing is provided with a rib on an outer circumference side of the flange of the rubber plug, that an end surface of the rib is orthogonal to an axis of the service hole, and that a relationship of $h1 \leq h2$ is established when a distance from an abutment surface of the lip seal to an end surface of the rubber plug on a side with the recessed section is set as h1 and a distance from the abutment surface of the lip seal to the end surface of the rib is set as h2.

3 Claims, 5 Drawing Sheets

(56) References Cited

U.S. PATENT DOCUMENTS

| | | | | |
|---|---|---|---|---|
| 6,152,752 | A * | 11/2000 | Fukuda | H01R 13/506 |
| | | | | 439/274 |
| 9,917,427 | B2 * | 3/2018 | Rost | H02G 3/088 |
| 2010/0313485 | A1 * | 12/2010 | Kuo | A45C 5/03 |
| | | | | 49/484.1 |
| 2012/0126536 | A1 * | 5/2012 | Takita | H02G 3/22 |
| | | | | 290/2 |
| 2014/0085781 | A1 * | 3/2014 | Zeng | H04M 1/236 |
| | | | | 361/679.01 |
| 2014/0268516 | A1 * | 9/2014 | Fathollahi | A45C 11/00 |
| | | | | 361/679.01 |

OTHER PUBLICATIONS

Communication dated Nov. 14, 2017, from Japanese Patent Office in counterpart application No. 2017-521415.

* cited by examiner

CASING AND RUBBER PLUG OF POWER CONVERSION EQUIPMENT

CROSS REFERENCE TO RELATED APPLICATIONS

This application is a National Stage of International Application No. PCT/JP2015/066021 filed Jun. 3, 2015, the contents of all of which are incorporated herein by reference in their entirety.

TECHNICAL FIELD

The invention relates to a casing and a rubber plug of a power conversion equipment and, in particular, relates to a casing and a rubber plug of a power conversion equipment having the rubber plug that seals a service hole used to join each component in the casing of the power conversion equipment.

BACKGROUND ART

In recent years, in order to improve environment performance of an automobile such as fuel economy, development and launching of a vehicle that uses electric power instead of a conventional internal combustion engine like an electric vehicle, a hybrid vehicle, or a fuel cell vehicle have rapidly been promoted. A power conversion equipment that converts the electric power to motive power is mounted on such an automobile. In addition, in order to achieve a high output characteristic and a high efficiency package, a water cooling method using an engine coolant has been a predominant method of cooing a heat generation element in the power conversion equipment. With this water cooling characteristic, an anti-vibration property, a waterproof property, salt water resistance, and dust resistance have been requested for a casing of the power conversion equipment that is mounted in an engine room.

Furthermore, in order to achieve high functionality, components such as a water-cooled heat sink that cools the heat generation element like a switching element, a control circuit substrate, and a booster converter are accommodated in the casing of the power conversion equipment. Moreover, a smoothing capacitor that suppresses a ripple current, a terminal block for electric power connection, a terminal block for motor connection, and the like are accommodated in the casing of the power conversion equipment. Then, those components are electrically joined by a harness and a bus bar of a high-pressure system and a low-pressure system.

In the power conversion equipment on which a large number of the components as described above are mounted, in order to reduce size, weight, and cost and improve the antivibration property and assemblability, each of the components, such as the control circuit substrate, is attached to the casing that also serves as a structural material. After portions of the casing, to each of which the components are attached, are fastened, the casing is electrically joined by using a service hole thereof, and the service hole is lastly sealed by a rubber plug (for example, see PTL 1).

CITATION LIST

Patent Literature

[PTL 1] JP-A-2011-163148

DISCLOSURE OF INVENTION

Technical Problem

When achievement of the high functionality of the power conversion equipment is attempted, the number of electrically joined sections and the number of the rubber plugs are increased. Thus, as a measure to improve the assemblability, it is desired to simultaneously attach the plural rubber plugs to the casing of the power conversion equipment by using an assembly jig. However, in a case of the rubber plug in the power conversion equipment disclosed in PTL 1, when it is attempted to hold a flange section of the rubber plug by using the assembly jig, the flange section of the rubber plug has to be thickened. In the case where the flange section of the rubber plug is thickened, the rubber plug is possibly detached when the flange section of the rubber plug is caught during an operation of the power conversion equipment.

The casing of the power conversion equipment is often made by aluminum die casting (an ADC 12 material) in consideration of lightening, a heat radiation property, and processing cost. However, the ADC 12 material that contains copper has low corrosion resistance. In order to improve the salt water resistance of a seal section, it is effective to extend the seal section as long as possible.

However, when the cylindrical seal section of the rubber plug is axially extended, the casing of the power conversion equipment is thickened, which leads to such a problem that downsizing and lightening are not simultaneously achieved.

In view of the above, it is effective to cause a flange surface of the rubber plug to abut against a casing surface of the power conversion equipment for the improved salt water resistance. However, in the case of the rubber plug disclosed in PTL 1, a measure for a clearance between the flange surface of the rubber plug and the casing of the power conversion equipment is not taken. Accordingly, there is such a problem that the salt water resistance is easily influenced by surface roughness, flatness, and an insertion position of the rubber plug in the casing of the power conversion equipment.

In addition, in order to absorb axial misalignment and improve an insertion property of the rubber plugs in the casing at a time when the plural rubber plugs are simultaneously attached by the assembly jig, it is desired to taper an opening of the casing. However, in the case of the rubber plug disclosed in PTL 1, when the opening is tapered, a flange diameter of the rubber plug has to be increased. Otherwise, a flange of the rubber plug is deformed during insertion. As a result, there occurs a problem of the increased clearance between the flange surface of the rubber plug and the casing of the power conversion equipment, which degrades the salt water resistance.

When the flange diameter of the rubber plug is increased to handle the above, there occurs a problem that an interval between the rubber plugs is extended to avoid interference of the adjacent flanges and the downsizing and lightening of the power conversion equipment are not simultaneously achieved.

The invention has been made to solve problems as described above and therefore has a purpose of obtaining a casing and a rubber plug of a power conversion equipment capable of simultaneously achieving assemblability of the rubber plug of the power conversion equipment and downsizing, lightening, a waterproof property, and salt water resistance of the power conversion equipment.

Solution to Problem

A casing and a rubber plug of a power conversion equipment according to the invention are a casing and a rubber plug of a power conversion equipment having plural service holes in a surface of the casing, and the plural service holes are used to electrically join a circuit in the casing of the power conversion equipment. It is characterized in that the rubber plug is provided to seal each of the service holes, that the rubber plug has core metal in a cylindrical cup shape, which has a disc-shaped flange on an outer side of the casing, therein, that a surface of the flange has a lip seal that abuts against the casing, that a cylindrical recessed section which is coaxial with a cylindrical seal surface is provided in a central section of the rubber plug on an opposite surface from the lip seal of the flange, that a tip of the rubber plug on a side not provided with the flange has a tapered surface, that an insertion opening for the rubber plug in the service hole has another tapered surface, that a surface of the casing is provided with a rib on an outer circumferential side of the flange of the rubber plug, that an end surface of the rib is orthogonal to an axis of the service hole, and that a relationship of h1≤h2 is established when a distance from an abutment surface of the lip seal to an end surface of the rubber plug on a side with the recessed section is set as h1 and a distance from the abutment surface of the seal to the end surface of the rib is set as h2.

Advantageous Effects of the Invention

According to the casing and the rubber plug of the power conversion equipment of the invention, an axial misalignment absorbing property and an insertion property in an opening at a time when the plural rubber plugs are simultaneously attached by an assembly jig are improved. Accordingly, such effects that the plural rubber plugs can simultaneously and easily be attached, that assemblability is improved, and that cost is cut are exerted. In addition, because a squeeze of the lip seal can be managed by height of the rib of the casing, a shape of the rubber plug, and a shape of the assembly jig in the power conversion equipment, an effect of securing a high waterproof property and high salt water resistance is exerted. Furthermore, because an excess load is not added to the flange of the rubber plug during insertion of the rubber plug, a diameter of the flange of the rubber plug can be minimized, and an interval between the adjacent rubber plugs is minimized. Thus, effects of downsizing and lightening of the power conversion equipment are exerted.

DESCRIPTION OF EMBODIMENTS

A description will hereinafter be made on a first embodiment of the invention on the basis of the drawing.

Note that, in each of the drawings, components with the same reference sign are the same or corresponding components.

First Embodiment

Figure 1:
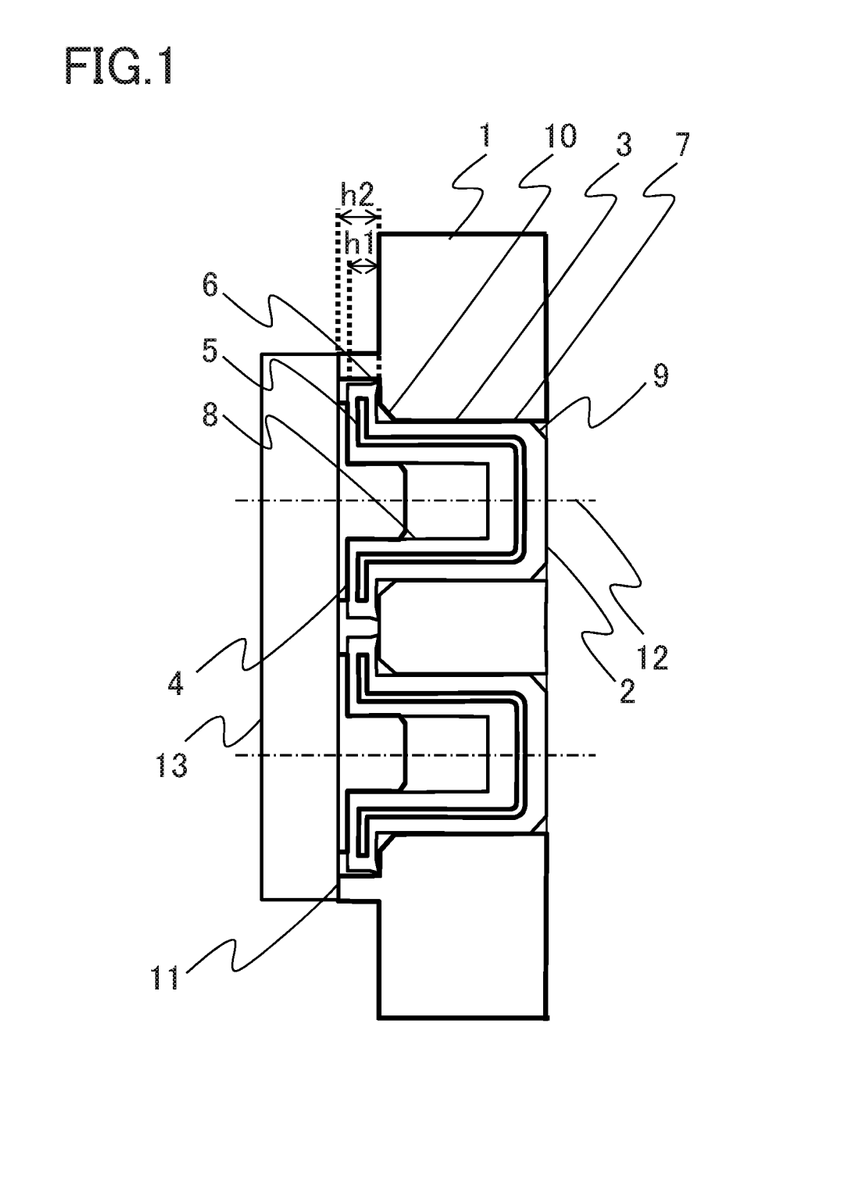
FIG. 1 is a cross-sectional view of a casing and a rubber plug of a power conversion equipment according to a first embodiment of the invention.

FIG. 1 is a cross-sectional view of a casing and a rubber plug of a power conversion equipment according to the first embodiment of the invention. In FIG. 1, a casing 1 of the power conversion equipment is provided with plural service holes 3, each of which penetrates the casing 1 inward from an outer surface thereof. Each of the service holes 3 is provided to electrically join an electrical circuit, such as fastening of a terminal block and a bus bar by a screw and soldering of a substrate and a terminal in the casing 1 of the power conversion equipment. In addition, a cylindrical rubber plug 2 is provided to seal this service hole 3. The rubber plug 2 has: a cylindrical seal surface 7 that is fitted to the service hole 3; and a flange 4 that abuts against the outer surface of the casing 1. The cylindrical rubber plug 2 has core metal 5 in a cylindrical cup shape, which has a disc-shaped flange on an outer side of the casing 1, therein.

In addition, the flame 4 that abuts against the casing 1 is provided with a lip seal 6 throughout a circumferential direction. A cylindrical recessed section 8 that is coaxial with the cylindrical seal surface 7 is provided in a central section of the rubber plug 2 on an opposite surface from the lip seal 6 of the flange 4. The recessed section 8 is used as an insertion hole of an assembly jig 13 when the rubber plug 2 is inserted in the casing 1 of the power conversion equipment. A tapered surface 9 is provided at a tip of the rubber plug 2 on a side that is not provided with the flange 4.

Furthermore, in the casing 1, the service hole 3 is provided with a tapered surface 10 on an insertion opening side of the rubber plug 2. On the outer surface of the casing 1 of the power conversion equipment, a rib 11 that is formed to be projected in an outward direction of the casing 1 is provided on an outer circumferential side of the flange 4 of the rubber plug 2. Height of the rib 11 which is provided in the casing 1 of the power conversion equipment, is equal to or greater than thickness of the flange 4 of the rubber plug 2.

Here, the thickness of the flange 4 means length thereof from an abutment surface of the lip seal 6 against the casing 1 to an end surface of the rubber plug 2 on a side provided with the recessed section 8, and the length is set as h1. In addition, the height of the rib 11 means length thereof from the abutment surface of the lip seal 6 against the casing 1 to an outer end surface of the rib 11, and the length is set as h2. Then, h1 and h2 has a relationship of h1≤h2. Note that the outer end surface of the rib 11 is orthogonal to a service hole axis 12.

In the power conversion equipment of the first embodiment, an axial misalignment absorbing property and an insertion property of the rubber plugs 2 in the service holes 3 by the assembly jig 13 at a time when the plural rubber plugs 2 are simultaneously attached are improved. As a result, the plural rubber plugs 2 can simultaneously and easily be attached, assemblability is improved, and cost can be cut.

In addition, because the assembly jig 13 can be pressed until abutting against the rib 11, which is provided on the surface of the casing 1. Accordingly, the rubber plug 2 can be inserted with a load that is high enough to be able to ignore variations in insertion resistance, and an effect of easy management of the insertion load during assembly is exerted.

Furthermore, in consideration of the height of the rib 11 of the casing 1, a shape of the rubber plug 2, and a shape of the assembly jig 13, a squeeze of the lip seal 6 can be managed. Thus, an effect of securing a high waterproof property and high salt water resistance is exerted.

Moreover, an excess load is not added to the flange 4 of the rubber plug 2. Thus, even when a diameter of the flange 4 of the rubber plug 2 is not excessively larger than an opening diameter of the tapered surface 10 of the casing 1, the flange 4 of the rubber plug 2 including the core metal 5 is not deformed. Thus, the assembly can be achieved with the squeeze of the lip seal 6 as being designed. As a result, the effect of securing the high waterproof property and the high salt water resistance is exerted.

Lastly, because the diameter of the flange 4 of the rubber plug 2 can be minimized, an interval between the adjacent rubber plugs 2 is minimized, which has an effect of downsizing and lightening the power conversion equipment. Because the diameter of the lip seal 6 is also minimized, this is effective to improve the waterproof property and the salt water resistance.

In addition, the rib 11 is provided on the casing 1 side instead of the assembly jig 13 side. Thus, the effect of easy management of an insertion position of the rubber plug 2 is exerted even when the surface of the casing 1 is a surface that is not orthogonal to the service hole axis 12 or a stepped surface.

Second Embodiment

Figure 2A:
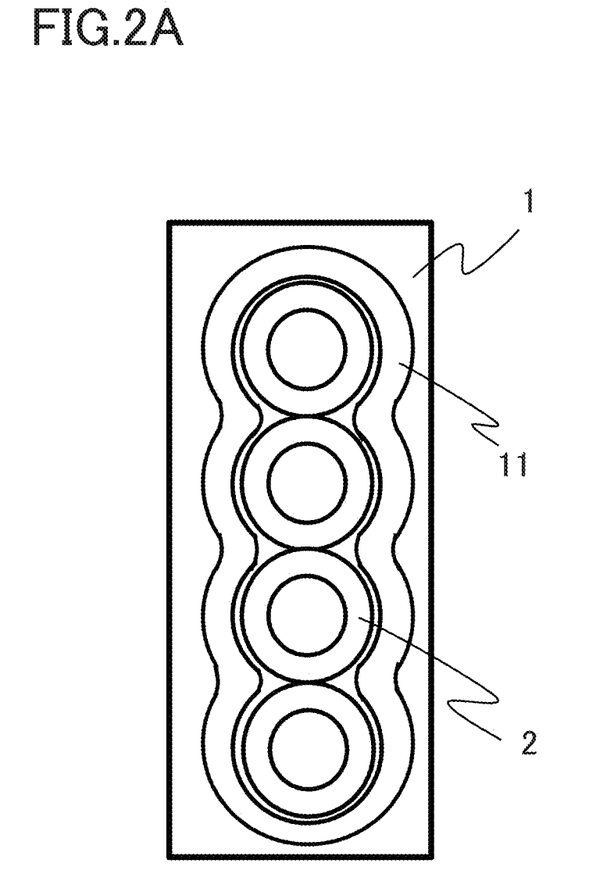
FIG. 2A and FIG. 2B include plan views of a lateral surface of a power conversion equipment according to a second embodiment of the invention.
Figure 2B:
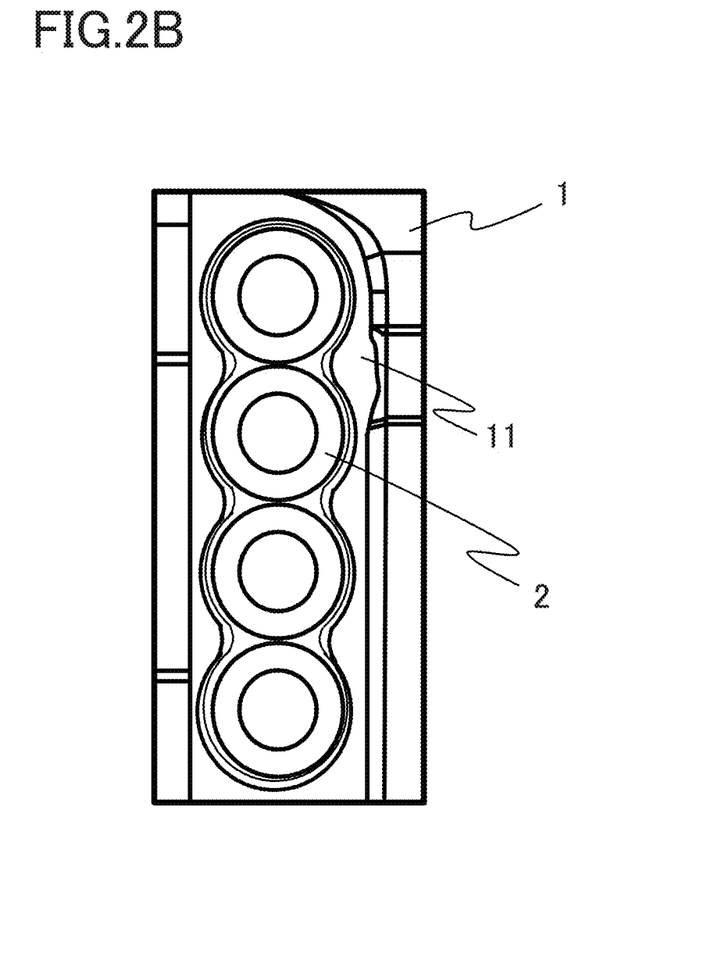

FIG. 2A and FIG. 2B include plan views at a time when a power conversion equipment according to a second embodiment of the invention is seen from a lateral surface side. In the second embodiment, a component with the same reference sign as the component in the first embodiment has the same configuration as that in the first embodiment, and thus a description thereon will not be made. As depicted in FIG. 2A and FIG. 2B, the rib 11 of the casing 1 is not provided at a position where the rubber plugs 2 are close co each other, but is provided to continuously surround the outer circumferences of the flanges 4 of the plural rubber plugs 2. The plural rubber plugs 2 are structured to be surrounded by the single rib 11. FIG. 2A and FIG. 2B depict different types of the power conversion equipment. In FIG. 2A and FIG. 2B, the shape of the rib 11 differs. The rib 11 in FIG. 2B is processed by a cutting machine, and an outer side thereof has a linear outer shape.

The power conversion equipment of the second embodiment has such an effect that the rib 11 surrounding an outer circumference of the lip seal 6 prevents detachment of the rubber plug 2, which is caused when the flange 4 of the rubber plug 2 is caught. In addition, due to provision of the rib 11 that surrounds the outer circumference of the lip seal 6, a direct impact of high-pressure water on the lip seal 6 can be prevented. Thus, an effect of securing the high waterproof property is exerted.

Third Embodiment

Figure 3:
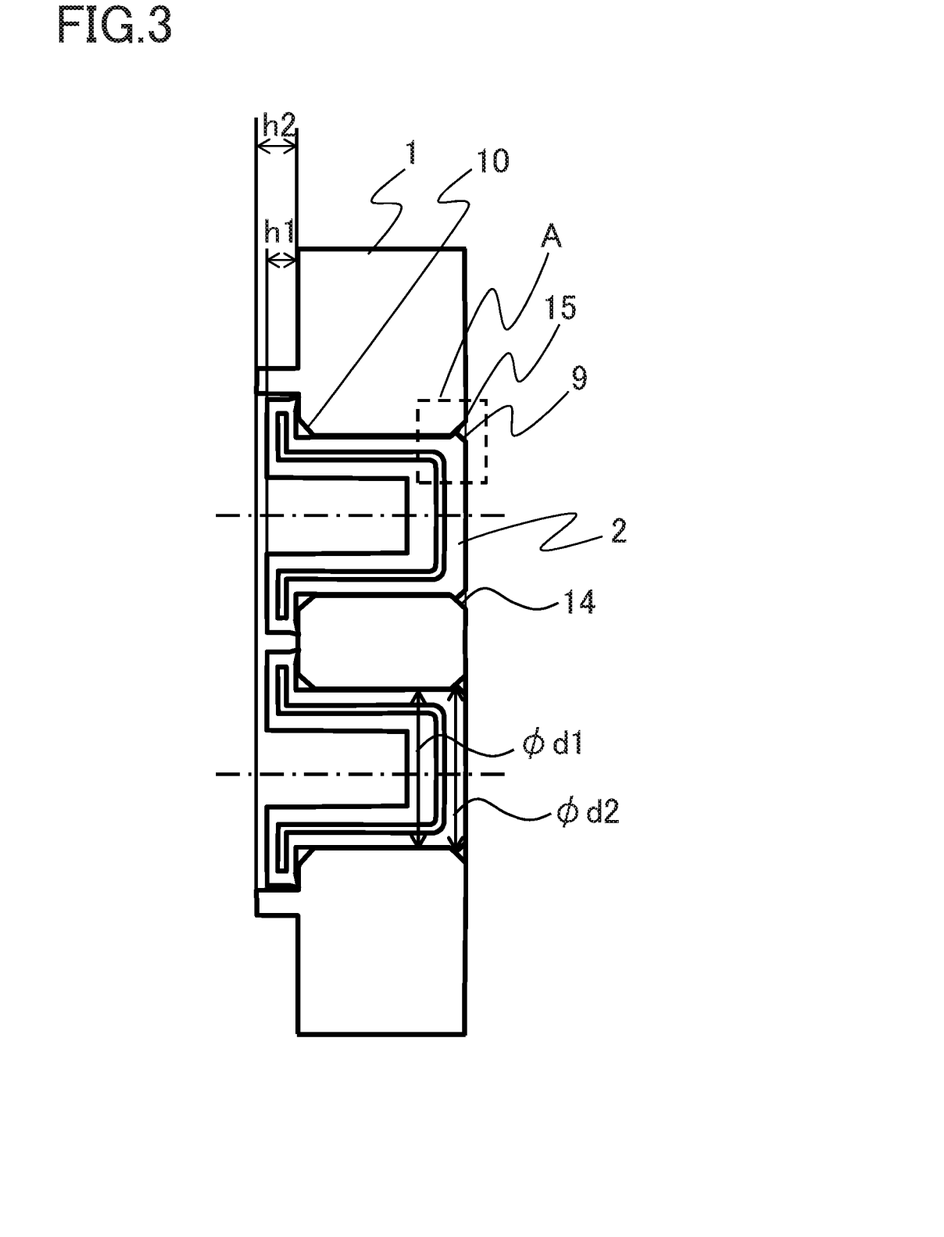
FIG. 3 is a cross-sectional view of a casing and a rubber plug power conversion equipment according to a third embodiment of the invention.
Figure 4:
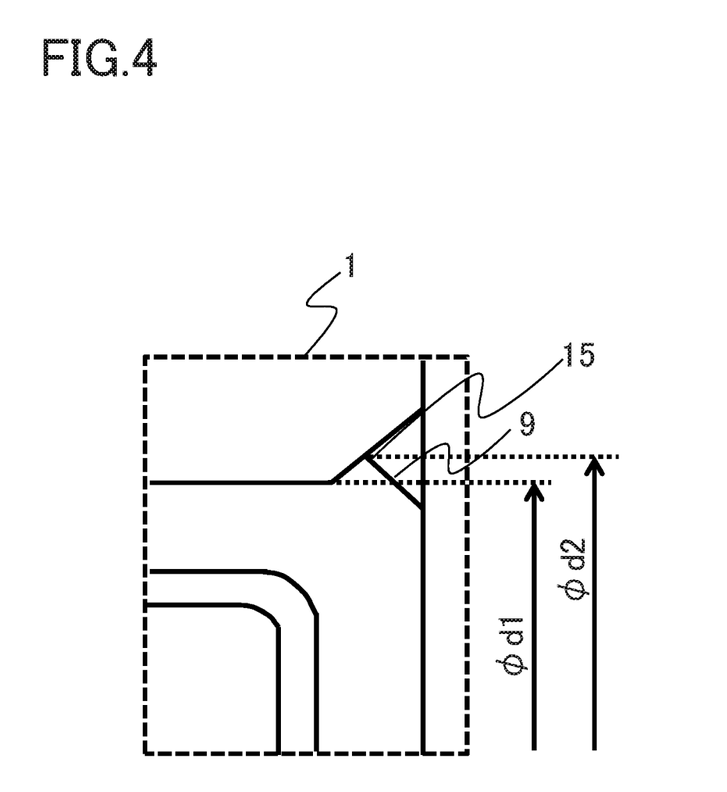
FIG. 4 is an enlarged view of main sections of the power conversion equipment in FIG. 3.

FIG. 3 is a cross-sectional view of a casing and a rubber plug of a power conversion equipment according to a third embodiment of the invention. In addition, FIG. 4 is an enlarged view of a section A in FIG. 3. In the third embodiment, a component with the same reference sign as the component in the first embodiment has the same configuration as that in the first embodiment, and thus a description thereon will not be made.

As depicted in FIG. 3, in the casing 1, a tapered surface 14 is provided in the service hole 3 on an inner side of the casing 1. In addition, the tip of the rubber plug 2 is provided with a large diameter section 15 in which a diameter of the rubber plug 2 is increased along the tapered surface 14 of the casing 1. When a diameter of the cylindrical seal surface 7 is set as $\phi d1$ and a diameter of the large diameter section 15 is set as $\phi d2$, a relationship of $\phi d1 < \phi d2$ is established.

The casing and the rubber plug of the power conversion equipment in the third embodiment have the effect of preventing the detachment of the rubber plug 2, which is caused by internal pressure of the casing 1 of the power conversion equipment. In addition, the insertion position of the rubber plug 2 is stabilized, and the squeeze of the lip seal 6 is stabilized in a state of being as designed. Thus, the high waterproof property and the high salt water resistance can be maintained for a long period.

Note that, in the invention, the embodiments can freely be combined, and each of the embodiments can appropriately be modified or omitted within the scope of the invention.

REFERENCE SIGNS LIST

1: Casing
2: Rubber plug
3: Service hole
4: Flange
5: Core metal
6: Lip seal
7: Cylindrical seal surface
8: Recessed section
9: Tapered surface
10: Tapered surface
11: Rib
12: Service hole axis
13: Assembly jig
14: Tapered surface
15: Large diameter section

The invention claimed is:

1. A casing and a rubber plug of a power conversion equipment having plural service holes in a surface of the casing, the plural service holes being used to electrically join a circuit in the casing of the power conversion equipment, the casing and the rubber plug of the power conversion equipment characterized in that
the rubber plug is provided to seal each of the service holes, the rubber plug has core metal in a cylindrical cup shape, which has a disc-shaped flange on an outer side of the casing, a flange of the rubber plug has a lip seal that abuts against the casing, a cylindrical recessed section which is coaxial with a cylindrical seal surface is provided in a central section of the rubber plug on an opposite surface from the lip seal of the flange, a tip of the rubber plug on a side not provided with the flange has a first tapered surface, an insertion opening for the rubber plug in the service hole has a second tapered surface, the surface of the casing is provided with a rib on an outer circumferential side of the flange of the rubber plug, an end surface of the rib is orthogonal to an axis of the service hole, and a relationship of $h1 \leq h2$ is established when a distance from an abutment surface of the lip seal to an end surface of the rubber plug on a side with the recessed section is set as h1 and a distance from the abutment surface of the lip seal to the end surface of the rib is set as h2.

2. The casing and the rubber plug of the power conversion equipment according to claim 1 characterized in that
the rib of the casing is not provided at a position where the rubber plugs are close to each other but is provided at another position in a manner to continuously surround outer circumferences of the flanges of the rubber plugs, and the plural rubber plugs are thereby surrounded by the single rib.

3. The casing and the rubber plug of the power conversion equipment according to claim 1 characterized in that a third tapered surface is provided in the service hole on an inner side of the casing, a large diameter section is provided at the tip of the rubber plug, and a relationship of $\phi d1 < \phi d2$ is established when a diameter of the cylindrical seal surface is set as $\phi d1$ and a diameter of the large diameter section is set as $\phi d2$.

\* \* \* \* \*